(12) United States Patent
Norris

(10) Patent No.: US 9,823,154 B2
(45) Date of Patent: Nov. 21, 2017

(54) BLEED AIR DUCT LEAK SYSTEM REAL-TIME FAULT DETECTION

(71) Applicant: KIDDE TECHNOLOGIES, INC., Wilson, NC (US)

(72) Inventor: Robert J. Norris, Wilson, NC (US)

(73) Assignee: KIDDE TECHNOLOGIES, INC., Wilson, NC (US)

( * ) Notice: Subject to any disclaimer, the term of this patent is extended or adjusted under 35 U.S.C. 154(b) by 456 days.

(21) Appl. No.: 14/539,485

(22) Filed: Nov. 12, 2014

(65) Prior Publication Data

US 2016/0131551 A1    May 12, 2016

(51) Int. Cl.

| | | |
|---|---|---|
| *G01K 13/00* | (2006.01) | |
| *G01K 15/00* | (2006.01) | |
| *G01M 3/00* | (2006.01) | |
| *B64D 13/00* | (2006.01) | |
| *B64F 5/00* | (2017.01) | |
| *G01R 31/02* | (2006.01) | |
| *G01R 31/00* | (2006.01) | |
| *G01K 13/02* | (2006.01) | |
| *B64F 5/60* | (2017.01) | |
| *G01R 31/28* | (2006.01) | |

(52) U.S. Cl.
CPC .............. *G01M 3/002* (2013.01); *B64D 13/00* (2013.01); *B64F 5/60* (2017.01); *G01K 13/02* (2013.01); *G01K 15/007* (2013.01); *G01R 31/008* (2013.01); *G01R 31/024* (2013.01); *G01K 2013/024* (2013.01); *G01R 31/2829* (2013.01)

(58) Field of Classification Search
CPC  G01R 31/008; G01R 31/2829; G01R 31/024; G01M 3/00; G01M 3/002; G01K 2013/024; G01K 15/007; G01K 7/026; G01K 13/02; B64D 2045/0085; B64D 13/00; B64F 5/60
See application file for complete search history.

(56) References Cited

U.S. PATENT DOCUMENTS

| | | | |
|---|---|---|---|
| 4,166,243 A | | 8/1979 | West et al. |
| 4,307,335 A | * | 12/1981 | Paulson ............... G01R 31/026 |
| | | | 324/537 |
| 4,532,601 A | * | 7/1985 | Lenderking ............ G01K 1/026 |
| | | | 374/E1.005 |

(Continued)

FOREIGN PATENT DOCUMENTS

| | | |
|---|---|---|
| EP | 2199202 A2 | 6/2010 |
| JP | 2005083989 A | 3/2005 |

OTHER PUBLICATIONS

Extended European Search Report of the European Patent Office for International Application No. EP 15194131, dated Mar. 21, 2016, 9 pages.

*Primary Examiner* — Randy Gibson
(74) *Attorney, Agent, or Firm* — Cantor Colburn LLP

(57) ABSTRACT

A method and apparatus for testing a duct leak detection system of an aircraft is disclosed. A sensor of the duct leak detection system is selected at an interface of the duct leak detection system. An alternating current is sent through the selected sensor and a resistance of the selected sensor is measured using the alternating current. An indicative signal is generated at the interface when the measured resistance of the selected sensor is outside of a specification of the selected sensor.

13 Claims, 6 Drawing Sheets

(56) References Cited

U.S. PATENT DOCUMENTS

| | | | | |
|---|---|---|---|---|
| 4,620,304 A * | 10/1986 | Faran, Jr. | ......... | G01R 31/31926 714/734 |
| 4,845,435 A * | 7/1989 | Bohan, Jr. | ............ | G01R 31/024 324/537 |
| 6,594,603 B1 * | 7/2003 | Eryurek | ................ | G01K 15/00 324/601 |
| 7,744,276 B2 * | 6/2010 | Webb | ..................... | G01K 7/026 136/200 |
| 8,449,181 B2 * | 5/2013 | Rud | ........................ | G01K 7/20 374/172 |
| 8,696,196 B2 * | 4/2014 | Monteiro | .............. | B64D 13/00 374/183 |
| 8,860,429 B2 * | 10/2014 | Froman | ............. | G01R 31/2829 324/522 |

\* cited by examiner

BLEED AIR DUCT LEAK SYSTEM REAL-TIME FAULT DETECTION

BACKGROUND OF THE INVENTION

Bleed duct air systems are used in jet aircraft in order to distribute heat from an airplane engine exhaust for use in other parts of the aircraft. For example, the heat from the engine exhaust may be used to warm a cabin of the aircraft or for more critical aspects of the aircraft. Bleed duct air systems include air ducts that lead from the engine exhaust to various locations within the aircraft. Due to the critical nature of heat transfer in operation of the aircraft, it is necessary monitor the air ducts for leaks, ruptures or other faults. An air duct monitoring system therefore includes one or more sensors placed at various locations along the air duct system. The sensors may be several feet long. These sensors measure a parameter of the air duct system that may be indicative of the state of the air duct (e.g., air duct pressure, air duct temperature) and provide relevant signals to a control system so that a pilot may be able to monitor the bleed duct air system from the cockpit.

During aircraft maintenance, it is necessary to test these sensors and circuit connections in order to determine whether the sensors are in good working order. Conventional methods of testing the sensors require removing the control system from its location in an electronics bay near the cockpit and attaching testing devices directly to the aircraft wiring at a rear interface of the control system in order to form a connection between the testing devices and the sensors. The testing devices are required to send alternating current through the sensors, since direct current can destroy the sensors. Such testing may therefore be performed when a suitable testing device is available at the location of the aircraft, which is generally infrequently due to the costs of such testing devices.

BRIEF DESCRIPTION OF THE INVENTION

According to one aspect of the invention, a method of testing a duct leak detection system of an aircraft includes: selecting a sensor of the duct leak detection system at an interface of the duct leak detection system; sending an alternating current through the selected sensor; measuring a resistance of the selected sensor using the alternating current; and generating an indicative signal at the interface when the measured resistance of the selected sensor is outside of a specification of the selected sensor.

According to another aspect of the invention, an apparatus for testing a bleed duct detection system includes: a circuit configured to: send an alternating current through a selected sensor of the bleed duct detection system, and measure a resistance of the selected sensor using the alternating current; and an interface for operation of the bleed duct detection system, the interface including: a selector switch for selecting the sensor of the duct leak detection system and sending the selected sensor to the circuit, and a display for generating an indicative signal when the measured resistance of the selected sensor is outside of a selected specification of the sensor.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

Figure 1:
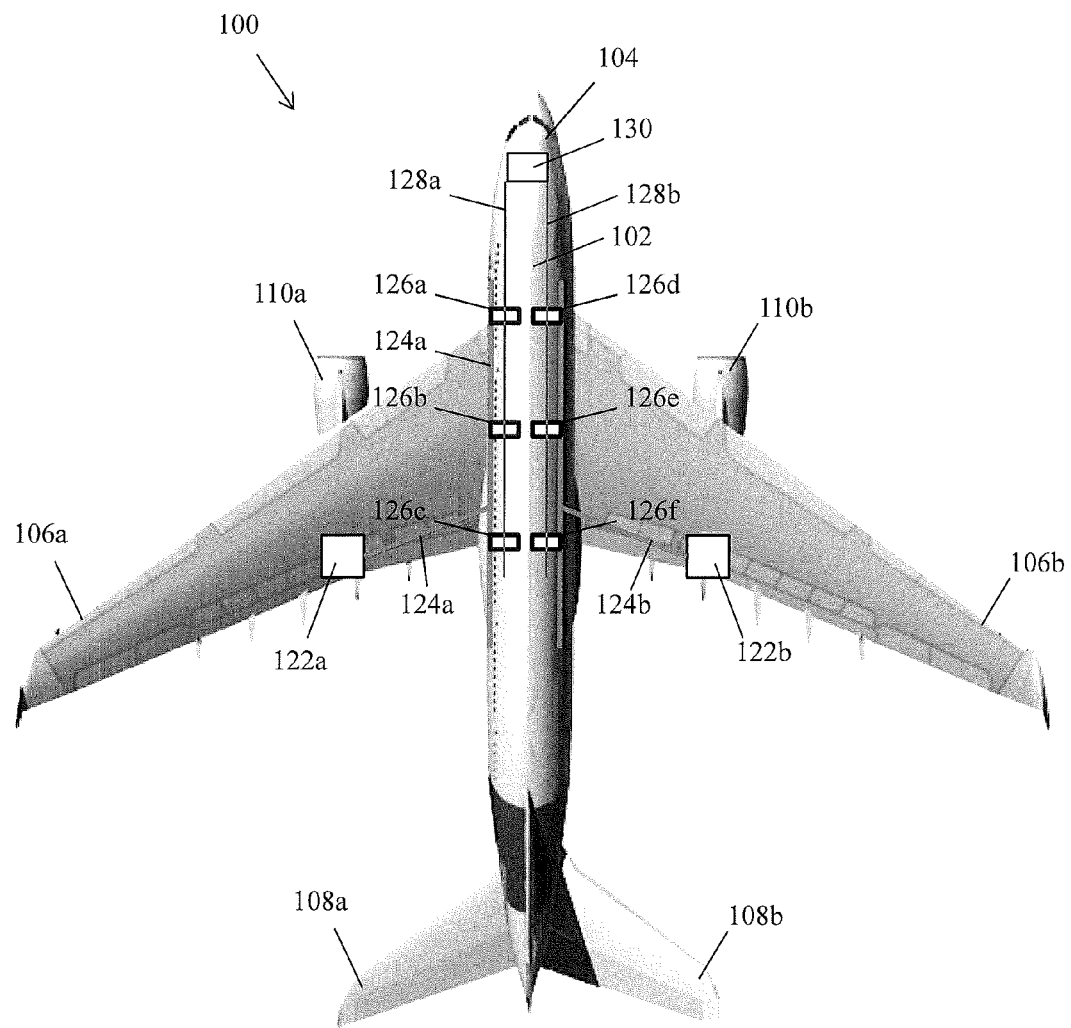
FIG. 1 shows an illustrative aircraft of the present invention.

FIG. 1 shows an illustrative aircraft 100 of the present invention. In one embodiment, the illustrative aircraft 100 is a Boeing 737. However any aircraft is contemplated for use with the invention disclosed herein. The aircraft 100 includes a fuselage 102, an electronics bay 104 (near a cockpit of aircraft 100), left wing 106a, right wing 106b, left stabilizer 108a and right stabilizer 108b. The left wing 106a includes a left engine 110a for propulsion of the aircraft and the right wing 106b includes a right engine 110b for propulsion of the aircraft 100. The illustrative aircraft 100 includes a bleed duct air system for distributing heat from the left engine 110a and the right engine 110 b to various parts of the aircraft 100. With respect to the left engine 110a, a bleed valve 122a bleeds heated air from an exhaust of the left engine 110a. The bleed valve 122a is connected to a bleed air duct 124a that distributes the air from the exhaust of the left engine 110a, thereby distributing heat from the left engine 110a to various locations of the aircraft. Similarly, a bleed valve 122b bleeds heated air from an exhaust of the right engine 110b. The bleed valve 122b is connected to a bleed air duct 124b that distributes the air from the exhaust of the right engine 110b, thereby distributing heat from the right engine 110b to various locations of the aircraft 100. In the illustrative embodiment, heat from the left engine 110a is distributed along a left side of the aircraft 100 and heat from the right engine 110ba is distributed along a right side of the aircraft 100. While the illustrative aircraft 100 shows two bleed air ducts 124a, 124b extending from fore to aft along the left and rights sides, respectively, of the aircraft 100, it is understood that there may be any number of bleed air ducts in the aircraft 100 which are designed to transfer heat from the left and right engines 110a, 110b to any number of locations within the aircraft 100.

Various sensors monitor the bleed air ducts 124a and 124b. For illustrative purposes three sensors 126a, 126b and 126c are shown coupled to bleed air duct 124a and three sensors 126d, 126e and 126f are shown coupled to bleed air duct 126b. The sensors measure a parameter of its associated bleed air duct 124a, 124b in order to determine a health of the associated bleed air duct 124a, 124b. In various embodiments, the parameter may be a pressure or a temperature in the bleed air duct 124a, 124b. Such parameters may be indicative of physical wear or rupture of the bleed air ducts 124a, 124b or other physical impairments that are critical to flight safety. For example, when a rupture occurs in an air duct, the temperature and pressure in the air duct can drop. A control system 130 is located in the electronics bay 104. The control system 130 sends and receives signals to the sensors 126a, 126b, 126c along a wire 128a extending from the control system 130 to sensors 126a, 126b and 126c. The parameter measured at the sensors 126a, 126b, 126c may be sent via the wire 128a to a control system 130 in the electronics bay 104 so that any faults, ruptures, or possible emergency situations with respect to the bleed air duct 124a may be observed by the pilot in real-time. Similarly, control system 130 may send a signal along wire 128b to sensors 126d, 126e and 126f and parameters measured by sensors 126d, 126e and 126f related to bleed air duct 124b may be sent to the control system via wire 128b.

Figure 2:
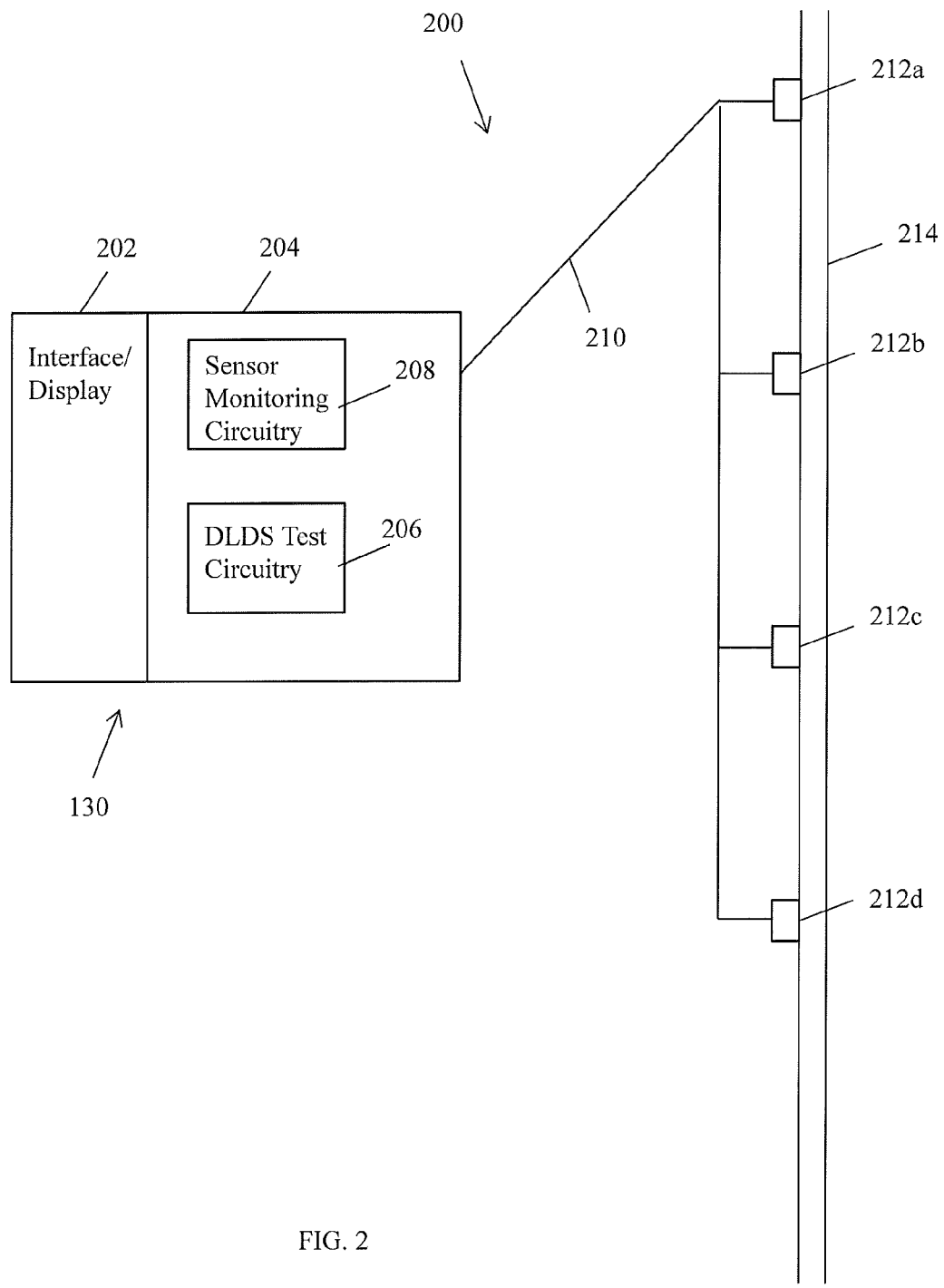
FIG. 2 shows a schematic diagram of a section of a duct leak detection system (DLDS) in one embodiment of the present invention.

FIG. 2 shows a schematic diagram of a section 200 of a duct leak detection system (DLDS) in one embodiment of the present invention. The duct leak detection system includes a control system 130 connected via wire 210 to sensors 212a-212d. The sensors 212a-212d are coupled to an air duct 214 in order to measure a parameter of the air duct 214 indicative of a rupture or break in the air duct 214. The control system 130 includes an interface 202 through which various measurements can be displayed to an operator such as a pilot. The interface 202 further includes various buttons, switches and other input devices through which the operator may input instructions in order to perform a test on the sensors 212a-212d.

The interface 202 of the control system 130 is coupled to back end circuitry 204 of the control system 130. The back end circuitry 204 includes DLDS test circuitry 206 that queries the sensors 212a-212d and receives signals from the sensors 212a-212d related to the parameter (e.g., pressure, temperature) of the air duct 214 measured by the sensors 212a-212d. The DLDS test circuitry 206 determines the health of the air duct 214 from the received signals. For example, the DLDS test circuitry 206 may compare a measurement of air duct temperature from sensors 212a-212d to a predetermined value or range of values. An alarm is generated at the interface 202 when a difference between the measured temperature and the predetermined temperature value is greater than a selected criterion, or when the measured temperature is outside of the range of values. Similar alarms may be generated based on air duct pressure or other suitable parameters.

The back end circuitry 204 of the control system 130 further includes a sensor monitoring circuitry 208 for monitoring the sensors 212a-212d. The sensor monitoring circuitry 208 determines or estimates a health of the sensors 212a-212d. A health of a sensor may be any criterion by which it can be determined that the sensor has failed or is nearing failure. In one embodiment, the sensor monitoring circuitry 208 sends a test current through a selected sensor to measure a resistance of the selected sensor. The measured resistance of the selected sensor may be indicative of the health of the selected sensor. The test current may be an alternating current in various embodiments. The interface 202 includes various input devices allowing the operator to use and operate the sensor monitoring circuitry 208 and various output devices in order to display test results along with a corresponding alert or signal indicating a faulty or unhealthy sensor. Thus, the sensors of the duct leak detection system may be tested without depowering the aircraft or removing the detection controller from the electronics bay 104. Exemplary interface configurations are discussed below and shown in FIGS. 3-6.

Figure 3:
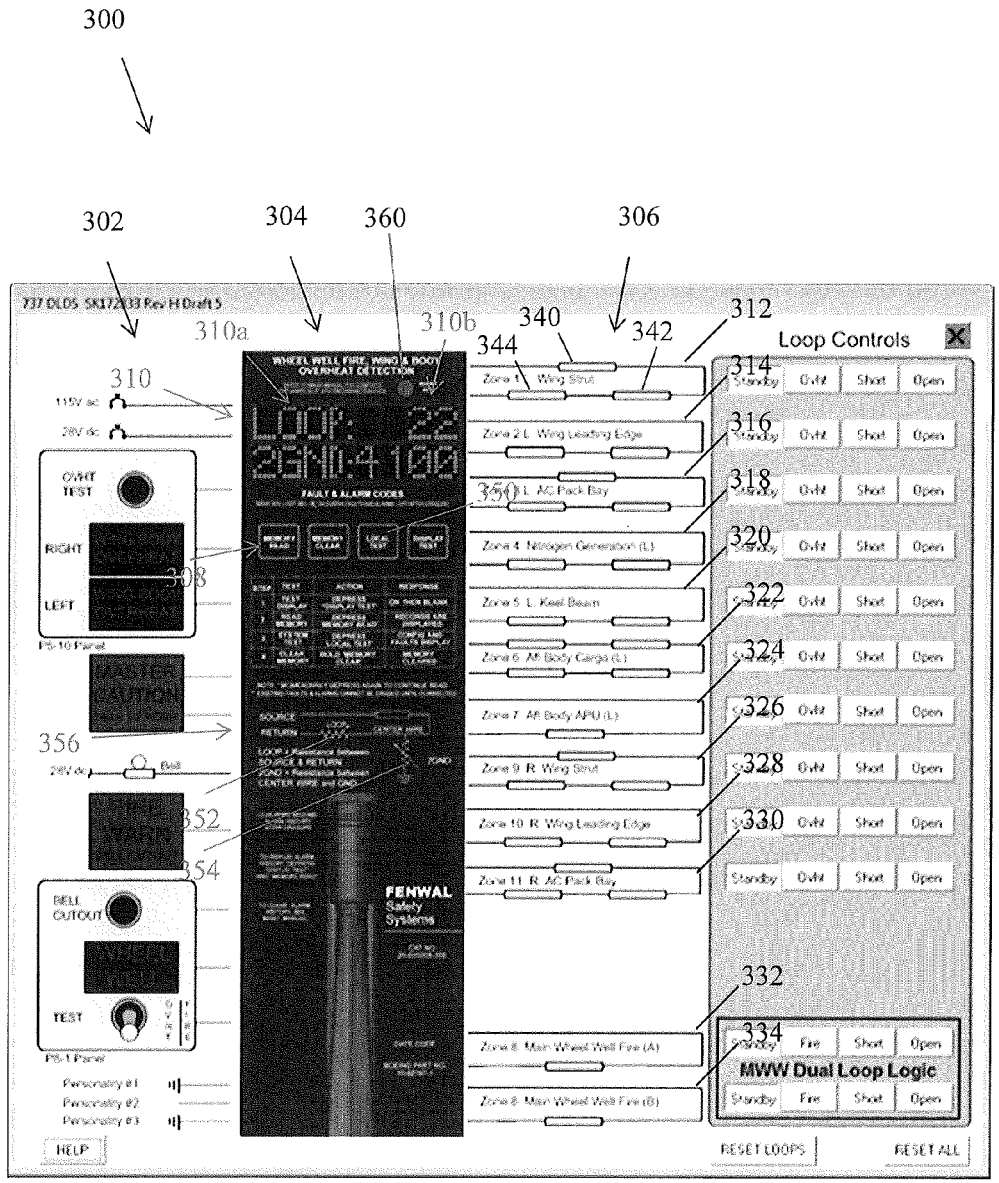
FIG. 3 shows an illustrative first configuration of an interface of the duct leak detection system.

FIG. 3 shows an illustrative first configuration 300 of interface 202. The interface includes various sections: a DLDS section 302 which displays results received from sensors related to the performance of the air ducts, a sensor test section 304 which displays results of the sensor tests using the methods disclosed herein, and a loop representation section 306 that displays representations of the various air duct sensor loops of the aircraft. The sensor test section 304 includes input devices 308 and a display 310 for facilitating the performing of tests on the various sensors of the bleed duct air system. The display 310 includes a label column 310a showing the names of the resistors being tested (e.g., LOOP (loop resistance) and 2GND (to-ground resistance)) and a results column 310b presenting the measured resistances. A Local Test button 350 at the sensors test section 304 (found among the input devices 308) may be used to select a sensor for testing. Once the sensor is selected, the sensor monitoring circuitry 208 sends a test current through the selected sensor and receives a measurement of resistance of the sensor in response to the test current. The resistance may include a loop resistance 352 and a to-ground resistance 354 of the sensors, as shown in circuit diagram 356. The resistance measurements may then be presented at display 310 of the interactive section. As shown in FIG. 3, the loop resistance of the selected sensor is 22 ohms and the to-ground resistance is 4100 ohms. For illustrative purposes, these resistance values are consistent with a properly working sensor. A warning light 352 (unlit in FIG. 3) may be illuminated when the selected sensor fails a test of the selected sensor.

Representation section 308 shows representations 312-334 of a plurality of loops associated with the air ducts of the aircraft, as illustrated in FIGS. 1 and 2. These representations include a left wing strut loop representation 312, a left wing leading edge loop representation 314, a left air-conditioning pack by loop representation 316, a left nitrogen generation loop representation 318, a left keel beam loop representation 320, an aft body cargo loop representation 322, an aft body APU loop representation 324, a right wing strut loop representation 326, a right wing leading edge loop representation 328, a right air-conditional pack bay loop representation 330, a main wheel well fire 'A' loop representation 332 and a main wheel well fire 'B' loop representation 334. As an illustrative example, the left wing strut loop representation 312 shows sensor representations 340, 342 and 344.

Figure 4:
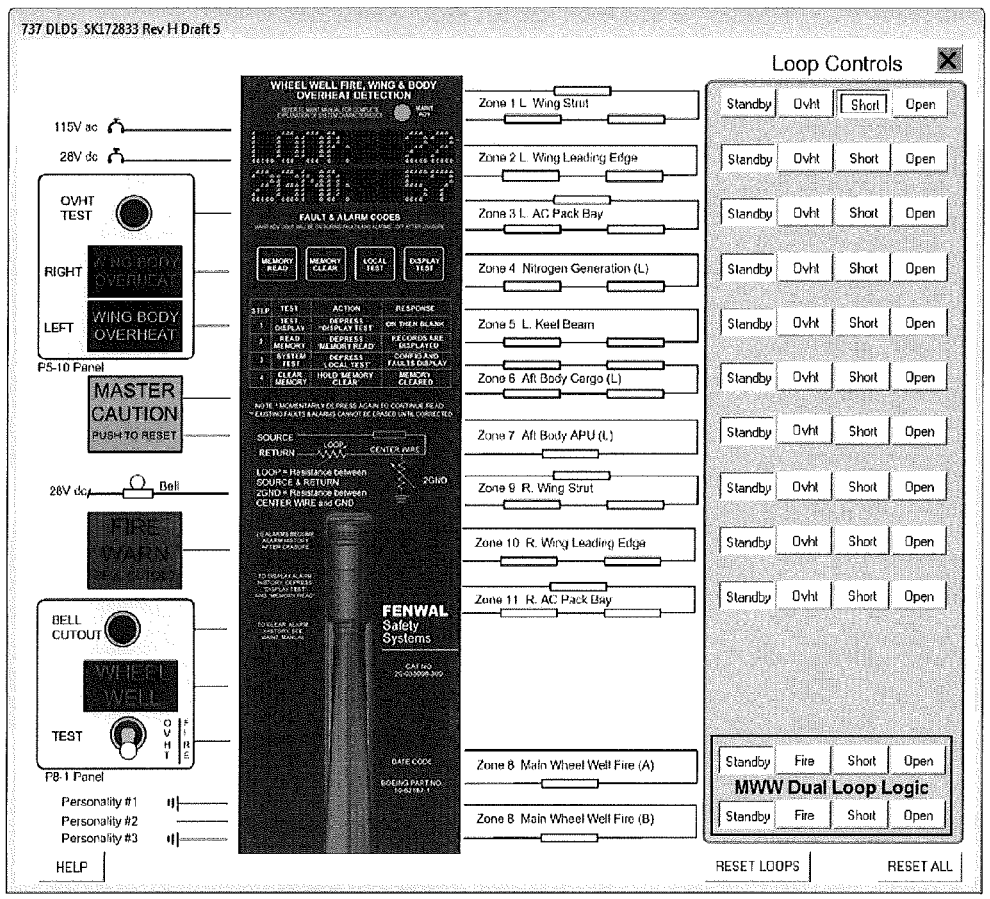
FIG. 4 shows a second configuration of the interface of the duct leak detection system.

FIG. 4 shows a second configuration 400 of the interface 202. The second configuration presents the results of a test on a sensor that is in relatively poor health. The measured loop resistance is 22 ohms. However, the measured to-ground resistance is 57 ohms, which may be considered outside of a range of resistance for a properly operating sensor. The warning light 352 is illuminated, consistent with the results of the resistance testing.

Figure 5:
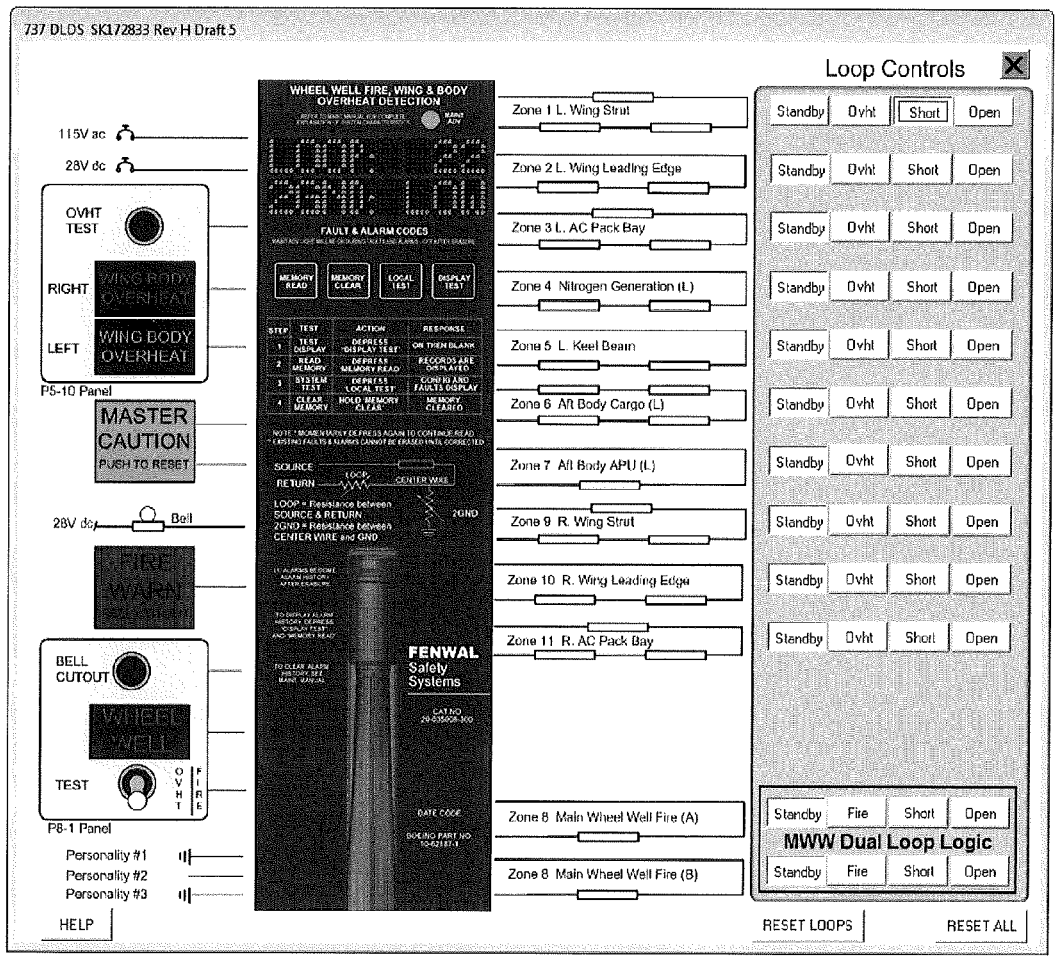
FIG. 5 shows a third configuration of the interface of the duct leak detection system.

FIG. 5 shows a third configuration 500 of the interface 202. The second configuration 400 and the third configuration 500 may be alternately displayed when selected sensor fails a test. The third configuration 500 explicitly notifies the user that the to-ground resistance of the selected sensor is incorrect. The word LOW is presented next to the to-ground resistance label (i.e., 2GND) to indicate that the measured to-ground resistance is below an acceptable value. Any other suitable alert or indicative signal may also or alternatively be presented to indicate that the measured to-ground resistance is below the acceptable value or otherwise outside of an acceptable range of values. The warning light 352 is illuminated, consistent with the results of the resistance testing.

Figure 6:
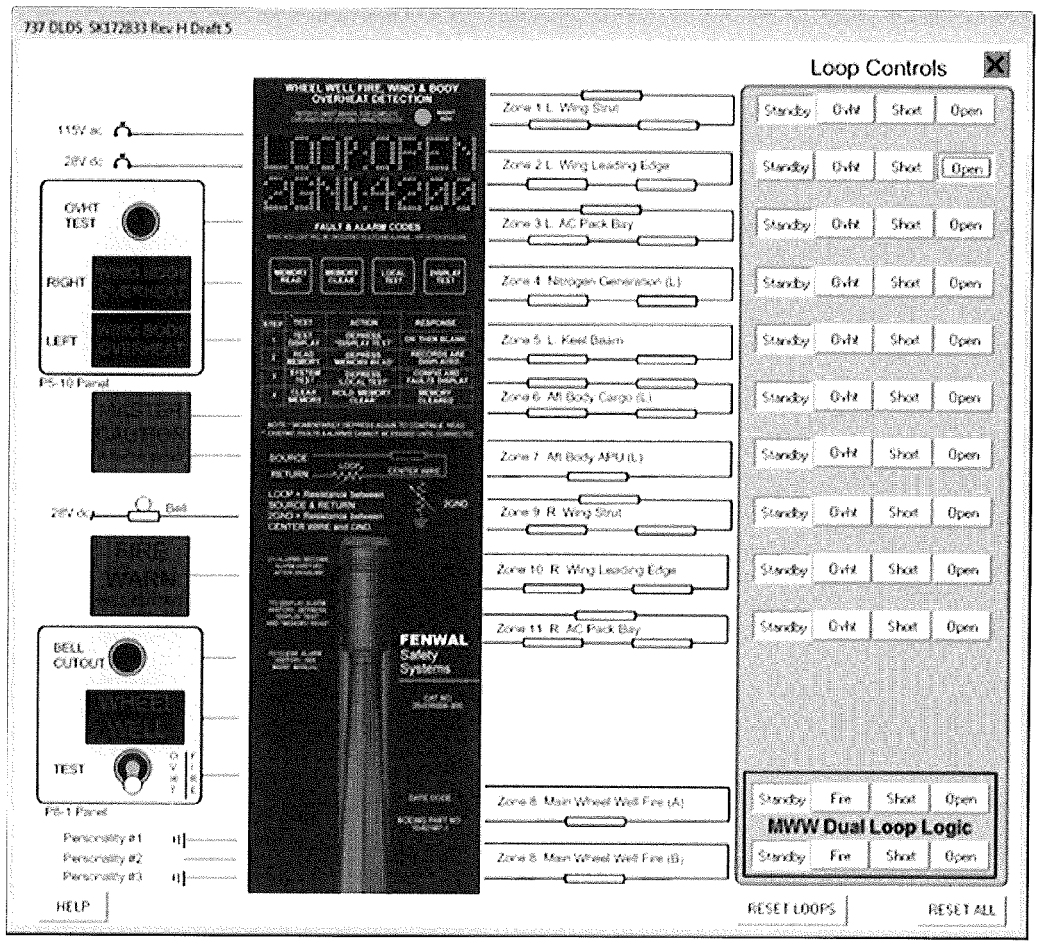
FIG. 6 shows a fourth configuration of the interface of the duct leak detection system.

FIG. 6 shows a fourth configuration 600 of the interface 202. The second configuration 400 and the fourth configuration 600 may be alternately displayed when selected sensor fails a test. The fourth configuration 600 explicitly notifies the user that the loop resistance of the selected sensor is incorrect or outside of an acceptable range of values. The word OPEN is presented next to the loop resistance label (i.e., LOOP) to indicate that the measured loop is an open circuit. Any other suitable alert or indicative signal may also or alternatively be presented to indicate that the measured loop resistance is outside of the acceptable range of values. The warning light 352 is illuminated, consistent with the results of the resistance testing.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A method of monitoring and interactively testing a duct leak detection system of an aircraft having bleed air ducts, comprising:
    monitoring in real time plural air duct sensors by a control system;
    displaying in real time, on an interface coupled to the control system, faults, ruptures or possible emergencies sensed by the sensors, wherein the interface includes a display and a selector switch;
    the method further comprising interactively:
        selecting with the interface, one of the sensors for sensor health testing;
        sending, by the control system, an alternating current through the selected sensor;
        measuring, by the control system, a resistance of the selected sensor (212) in response to the test current, wherein the resistance is a loop resistance (352) and a to-ground resistance (354) related to the selected sensor (212); and
        displaying, with the interface measured results; and
        in additional to displaying measured results, generating an indicative signal that is displayed with the interface when the measured resistance of the selected sensor is outside of a specification of the selected sensor.

2. The method of claim 1, further comprising measuring the resistance of the selected sensor when the airplane is in a powered state.

3. The method of claim 1, wherein the resistance is indicative of a health of the sensor.

4. The method of claim 1, further comprising testing an air duct associated with the selected sensor using a command selected from the interface.

5. The method of claim 1, further comprising displaying the resistance of the selected sensor at the interface.

6. The method of claim 1, further comprising selecting a command at the interface to send the alternating current through the selected sensor.

7. An apparatus for monitoring and interactively testing a bleed duct detection system having bleed air ducts, comprising:
    an interface, that includes a display and a selector switch, for operation of the bleed duct detection system;
    a circuit coupled to the interface, the circuit configured to:
    monitor in real time plural air duct sensors;
    display in real time, with the interface, faults, ruptures or possible emergencies sensed by the sensors;
    the circuit further configured to interactively:
        receive a selection from the interface, one of the sensors of the duct leak detection system for sensor health testing;
        send a test current which is an alternating current through the selected sensor of the bleed duct detection system, and
        measure a resistance of the selected sensor in response to the test current, wherein the resistance is a loop resistance and a to-ground resistance; and
        display, with the interface, measured results; and
        in additional to the display of the measured results, display, with the interface an indicative signal generated when the measured resistance of the selected sensor is outside of a selected specification of the selected sensor.

8. The apparatus of claim 7, wherein the circuit is further configured to measure the resistance of the selected sensor when the airplane is powered up.

9. The apparatus of claim 7, wherein the interface is located in an electronics bay of the aircraft.

10. The apparatus of claim 7, further comprising a circuit for testing an air duct associated with the selected sensor.

11. The apparatus of claim 7, wherein the interface is adapted to display a resistance value of the selected sensor at the interface.

12. The apparatus of claim 7, wherein the interface is adapted to display a loop circuit for the selected sensor at the interface.

13. The apparatus of claim 7, further comprising a test circuit for measuring a parameter of the bleed duct using the selected sensor.

* * * * *